US009740111B2

(12) United States Patent
Sundarrajan et al.

(10) Patent No.: US 9,740,111 B2
(45) Date of Patent: Aug. 22, 2017

(54) ELECTROSTATIC CARRIER FOR HANDLING SUBSTRATES FOR PROCESSING (71) Applicants: Arvind Sundarrajan, San Jose, CA (US); Jen Sern Lew, Singapore (SG); Sriskantharajah Thirunavukarasu, Singapore (SG); Karthik Elumalai, Bangalore (IN)

(72) Inventors: Arvind Sundarrajan, San Jose, CA (US); Jen Sern Lew, Singapore (SG); Sriskantharajah Thirunavukarasu, Singapore (SG); Karthik Elumalai, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 630 days.

(21) Appl. No.: 14/280,102

(22) Filed: May 16, 2014

(65) Prior Publication Data
US 2015/0331337 A1 Nov. 19, 2015

(51) Int. Cl.
H01T 23/00 (2006.01)
G03F 7/20 (2006.01)
H01L 21/683 (2006.01)

(52) U.S. Cl.
CPC ...... G03F 7/70733 (2013.01); H01L 21/6833 (2013.01)

(58) Field of Classification Search
CPC .................................... G03F 7/70733
(Continued)

(56) References Cited

U.S. PATENT DOCUMENTS 4,962,441 A * 10/1990 Collins ............. H01L 21/67748
118/500
5,788,814 A * 8/1998 Sun ...................... A61K 9/2072
118/DIG. 2
(Continued)

FOREIGN PATENT DOCUMENTS

JP 04-237148 8/1992
JP 2004-260088 9/2004
(Continued)

OTHER PUBLICATIONS

PCT/US2015/030202, "Notification of Transmittal of the International Search Report and the Written Opinion of the International Searching Authority, or the Declaration" mailed May 11, 2015, pp. 10.

Primary Examiner — Stephen W Jackson
(74) Attorney, Agent, or Firm — Blakely Sokoloff Taylor & Zafman LLP (57) ABSTRACT An electrostatic carrier is described for carrying a substrate for handling through different processes. The carrier has a dielectric plate having a top side and a bottom side and configured to be attached on a top side of the plate to a substrate using electrostatic force, and a base plate coupled to a bottom side of the dielectric plate. Electrodes are formed on the base plate and extend across the base plate parallel to the top side of the dielectric plate. The electrodes are configured to carry an electrostatic charge and formed so that electrodes of a first charge are positioned near electrodes of a second charge. Connectors extend through the base plate to the electrodes to couple the electrodes to a source of electrostatic charge.

20 Claims, 11 Drawing Sheets (58) Field of Classification Search
USPC .......................................................... 361/234
See application file for complete search history.

(56) References Cited

U.S. PATENT DOCUMENTS

| | | | |
|---|---|---|---|
| 6,120,661 | A | 9/2000 | Hirano et al. |
| 6,215,643 | B1 * | 4/2001 | Nagasaki ............... H02N 13/00 279/128 |
| 7,619,870 | B2 * | 11/2009 | Himori ............... H01L 21/6833 361/230 |
| 9,460,950 | B2 * | 10/2016 | Cox .................... H01L 21/6833 |

FOREIGN PATENT DOCUMENTS

| | | |
|---|---|---|
| JP | 2008-028297 | 2/2008 |
| JP | 2008-244149 | 10/2008 |

* cited by examiner

ELECTROSTATIC CARRIER FOR HANDLING SUBSTRATES FOR PROCESSING

BACKGROUND

Semiconductor and micromechanical chips are typically formed starting with a wafer, typically a silicon wafer. The wafer is typically round and about 300 mm in diameter, however, other wafer shapes are also occasionally used. The chips are formed on the surface of the wafer using a variety of different process chambers that may involve plasma, vapor deposition, photo-lithography and mechanical processes such as grinding, machining, and drilling. The circuits and other components formed on the wafer are normally quite thin and make up only a small part of the thickness of the wafer.

In order to make semiconductor and micromechanical chips smaller, there are efforts to reduce the thickness of the wafer that forms the substrate on which the active circuitry is formed. One way to reduce the thickness of the wafer is to grind the backside of the wafer after the circuits have been formed on the front side. Another way is to use a thinner wafer from the beginning. Unfortunately thin wafers warp and break easily. In order to prevent warpage and breaking, a thick wafer is first bonded to a glass or silicon substrate using an adhesive. After, bonding, the front side of the wafer is thinned, typically by mechanical grinding. The circuits and other components are then formed on the front side of the wafer. The completed thinned wafer is then de-bonded from the substrate.

SUMMARY

An electrostatic carrier is described for carrying a substrate for handling through different processes. The carrier has a dielectric plate having a top side and a bottom side and configured to be attached on a top side of the plate to a substrate using electrostatic force, and a base plate coupled to a bottom side of the dielectric plate. Electrodes are formed on the base plate and extend across the base plate parallel to the top side of the dielectric plate. The electrodes are configured to carry an electrostatic charge and formed so that electrodes of a first charge are positioned near electrodes of a second charge. Connectors extend through the base plate to the electrodes to couple the electrodes to a source of electrostatic charge.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

The present description is presented in the context of a semiconductor or silicon wafer carrier for carrying a semiconductor or silicon wafer, however the invention is not so limited. The wafer carrier may be used to carry a variety of different other types of substrates, including gallium arsenide, lithium niobate, amorphous dielectric such as glass and ceramics. The wafer carrier is accordingly a substrate carrier that may be adapted to a variety of purposes.

A wafer carrier can be produced that electrostatically bonds to a thin wafer. The electrostatic bond can be released electrically by neutralizing the electrostatic charge that holds the wafer to the carrier. This avoids the stress, contamination and possible injury that may be caused when releasing an adhesive bond. An electrostatic wafer carrier may be made using a rigid dielectric substrate with embedded conducting electrodes. The electrodes form an interdigitated mesh of varying widths and gaps between the fingers. The carrier thickness may be approximately 1 mm and the diameter just larger than that of the wafer, for example approximately 301 mm.

In use, a wafer is first placed on the wafer carrier. The carrier is then electrically charged by a control unit through application of high voltages across the embedded electrodes. The applied voltages create localized bipolar electrostatic attraction across the wafer and carrier, resulting in an electrostatically bonded stack of wafer and carrier. Such a wafer carrier may be able to retain sufficient bonding for longer than ten days without any additional application of voltages. The bonded stack can be handled as if it were a single wafer to undergo any relevant semiconductor or micromachining processing steps. This handling may include being carried by a vacuum or electrostatic chuck into and out of various process chambers.

In general, the electrostatic bonding strength between the wafer and the carrier is strongest for conducting materials and weakest for insulating materials. However, the electrode layout and charging algorithm may be optimized as described herein for each class of materials to enable sufficient bonding. The duration of the bond may be increased by incorporating a high capacitance sheet material into the carrier to increase the amount of charge stored by the carrier.

The wafer carrier may be enhanced in a variety of different ways. As an example, a hydrophobic coating may be applied to the exterior surface of the carrier to ensure that liquids do not enter the bonding interface. Liquids may be able to neutralize the electrostatic charge. The hydrophobic coating may be used, for example, in applications which require wet chemistry compatibility A finely polished aluminum nitride, AlN, or similar ceramic dielectric substrate may be used to maintain flatness and prevent voids. Aluminum nitride for example has a high dielectric constant and very good chemical and thermal resistance. This is particularly useful in applications where the bonded wafer will be subjected to strong tensile and shear forces, such as in the case of wafer thinning by grinding. An AlN ceramic dielectric also provides good thermal conductivity which is useful in applications where the bonded wafer will be subjected to processes that are very sensitive to temperatures, such as PVD (Plasma Vapor Deposition), CVD (Chemical Vapor Deposition), and etch processes.

A variety of different electrode layouts and configurations are described herein that may be embedded within the wafer carrier. The electrodes may be optimized to provide a strong bonding strength and charge carrying parameters for different applications. The electrodes may be optimized for wafers that have additional coatings such as polyimide, oxide, nitride, or any other combination of layers and coatings. A different optimization may be used where insulator materials such as glass and epoxy are used for bonding. The wafers may be made of silicon, lithium niobate, gallium arsenide, or any of a variety of other materials. The carrier may also be used to carry other types of substrates. The particular design and configuration of the carrier may be adapted to suit different types of substrates.

Figure 1A:
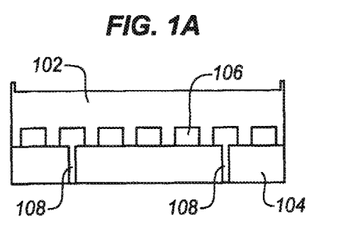
FIGS. 1A and 1B are diagrams of an electrostatic substrate carrier in cross-sectional and exploded isometric view in accordance with an embodiment of the invention.

FIG. 1A is a cross-sectional diagram of a portion of a wafer carrier according to one embodiment. While the carrier is referred to as a wafer carrier, the invention is not so limited. The carrier may be used to electrostatically grip and carry a variety of different types of substrates. This wafer carrier has a full aluminum nitride two-part body. Aluminum nitride is a ceramic material with a high dielectric constant and a low coefficient of thermal expansion. The wafer carrier has an upper ceramic body 102 and a lower base plate 104. A series of electrodes 106 are formed on the base plate and connectors 108 connect the electrodes to an external power supply.

The top dielectric plate 102 is configured to electrostatically attach to a silicon or other type of wafer (not shown) using the field created by the electrodes 106. The base plate is fastened to the dielectric plate and both are typically round and of about the same size. As mentioned, the plates are approximately the same size as the wafer that the plates are designed to carry. For a 300 mm wafer, the plates may be about 305 mm. For a 450 mm wafer, the plates may be about 455 mm.

Figure 1B:
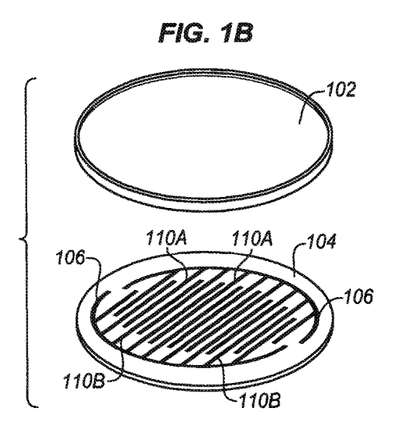

FIG. 1B is an exploded isometric view of the two-part wafer carrier of FIG. 1A. The top dielectric plate is shown as having a smooth top surface, as mentioned above, the carrier surface may be polished. Bumps (not shown) may then optionally be formed over the top to provide a displacement between the top plate and the wafer. The particular configuration and shape of the top surface may be adapted to suit a variety of different wafers which this wafer carrier is to carry.

The base plate 104 has two sets of electrodes 106 which are formed over the ceramic base plate 104. The two different sets of electrodes have opposite charges so that the first electrode is positively charged and a second electrode is negatively charged or vice versa. As shown, the electrodes extend in long fingers 110A for the one polarity and 110B for the opposite polarity. The two sets of fingers alternate across the surface of the electrode so that the wafer experiences variations between the positive and negative electric field across the surface of the dielectric plate 102. These fingers of electrodes are therefore interdigitated across the surface of the base plate.

The base plate with the electrodes is joined to the top plate so that the electrodes are proximate or even adjacent to the top plate. The electrodes are then able to induce an electrostatic field in the top plate. The top plate may be made thin so that the electrostatic field is applied through the top plate to the wafer carried by the two-piece carrier. The electrodes are embedded within the two pieces where they are protected. The electrodes are accessible through the connectors 108 through the base plate from the bottom of the base plate to the electrodes on the top of the base plate.

Figure 2A:
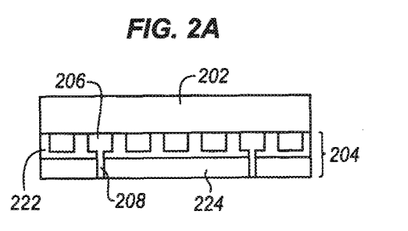
FIGS. 2A and 2B are diagrams of an electrostatic substrate carrier in cross-sectional and exploded isometric view in accordance with a second embodiment of the invention.

FIG. 2A shows an alternate configuration for the wafer carrier in which a top dielectric plate 202 is ceramic as in FIG. 1A but the base plate is formed of two different pieces formed of two different materials which are sandwiched together. The base plate 204 has an upper portion 222 formed of a first piece of dielectric material such as silicon oxide, silicon nitride, or polyimide and a bottom portion 224 formed of a second piece of dielectric non-conductive material such as bare silicon or glass. A pattern of electrodes 206 is formed on the base plate. In the illustrated example the electrodes are formed on the top portion 222 of the base plate with connectors 208 through both pieces of the base plate to connect the electrodes to an external power source. This allows the electrodes to be as close as practicable to the wafer that is to be carried on the carrier.

Figure 2B:
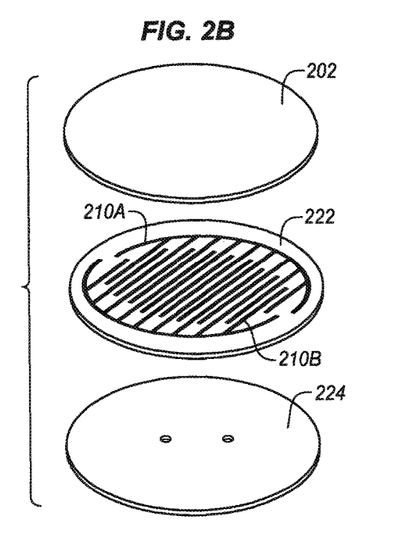

FIG. 2B is an exploded isometric view of the three parts of the wafer carrier of FIG. 2A. As shown, the top plate 202 is formed of a ceramic such as, but not limited to, aluminum nitride. The top part of the base plate 222 is formed of a silicon, a polyimide, or an amorphous material, such as glass. The electrodes, both positive electrodes 210A and negative electrodes 21013, are formed over the top portion of the base plate. The electrode pattern is the same as that of FIG. 1B, however, other patterns may be used on this and any of the other embodiments. These may be formed by spin coating, plating, screen printing, or in any other way.

The bottom piece 224 is then bonded to the top piece to form a single base plate 204 which is then fastened to the dielectric plate 202. This forms the sandwiched structure shown in cross-section in FIG. 2A. Alternatively, the AlN top plate may be deposited over the base plate and the electrodes. The example wafer carrier of FIG. 2A may be simpler to construct because the top plate of the base plate is formed of a silicon or polyimide material. This allows standard semiconductor processing technologies to be used to apply the electrodes to the base plate. After using the standard semiconductor processes, the ceramic base plate may is attached or formed over the base plate and the electrodes to attach to the wafer that is to be carried.

Figure 3A:
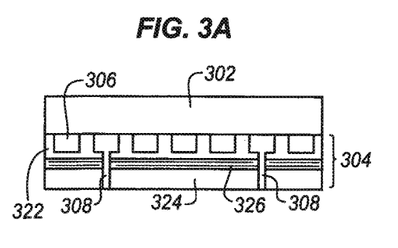
FIGS. 3A and 3B are diagrams of an electrostatic substrate carrier in cross-sectional and exploded isometric view in accordance with a third embodiment of the invention.

FIG. 3A is a cross-sectional side view diagram of another alternative implementation of a wafer carrier. A dielectric plate 302 is carried by a base plate 304. The base plate is made from four pieces. A top plate 322 of the base plate may be formed of a silicon oxide, silicon nitride, polyimide, or any of a variety of other materials as in the example of FIG. 2A. The top portion of the base plate carries the electrodes 306. A bottom portion 324 of the base plate may also be formed of a bare silicon or of a glass material. A capacitor portion 326 is embedded between the top piece of the base plate and the bottom piece of the base plate. This embedded capacitor allows the wafer carrier to hold an electrostatic charge for a longer period of time.

Using this construction, the electrostatic charge on the electrodes 306 may be able to carry a wafer for several days without applying additional electrical charge to the electrodes. The electrodes of FIG. 3A are formed below the dielectric plate and are coupled to external sources of power by connectors 308 through the base plate.

Figure 3B:
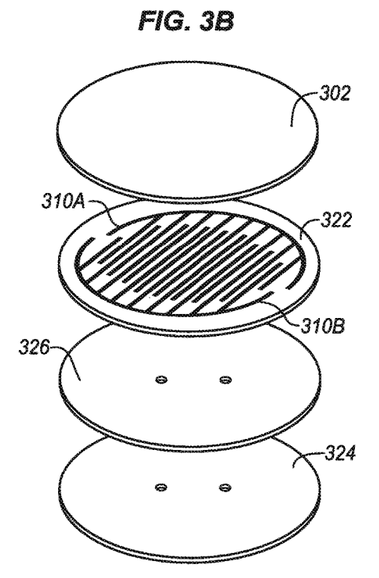

FIG. 3B is an exploded diagram of the wafer carrier of FIG. 3A. Here each of the pieces 302, 322, 326, 324 of the base plate 304 is shown. The dielectric top plate 302 is attached or deposited over the base plate 304 which includes the polymer top piece with electrodes 310A and 310B, the capacitor piece 326 and the bottom piece 324.

Figure 4A:
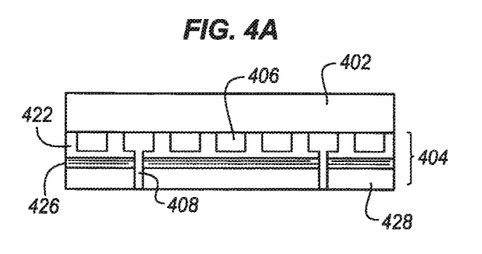
FIGS. 4A and 4B are diagrams of an electrostatic substrate carrier in cross-sectional and exploded isometric view in accordance with a fourth embodiment of the invention.

FIG. 4A shows a further alternate implementation of the carrier wafer as a partial cross-sectional side view. A ceramic top plate 402 is attached to a base plate 404. The base plate includes an upper portion 422 formed of a piece of silicon dioxide, silicon nitride, or polyimide. Electrodes 406 have been formed on the top portion of the base plate. These are in contact with or in close proximity to the dielectric plate of the wafer carrier when the base plate is attached to the dielectric plate. The electrodes are powered by connectors 408 to an external power source.

As in the example of FIG. 3A, the cross-sectional diagram of FIG. 4A also includes an embedded capacitor 426. However, the embedded capacitor, in this case, is sandwiched between the polymer upper portion or top portion 422 of the base plate and a ceramic bottom portion 428 of the base plate. There is no bare silicon or glass plate as in the example of FIG. 3A.

Figure 4B:
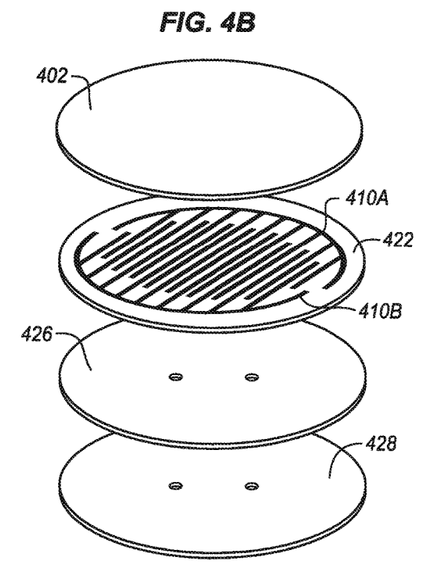

FIG. 4B is an isometric exploded view diagram showing the three pieces of the base plate 404. A positive electrode 410A and a negative electrode 410B are formed over the top of the top portion of the base plate. As in the examples of FIGS. 1B, 2B, and 3B, the positive electrode 410A is shaped in the form of a large peripheral arc with parallel fingers extending from the arc across the surface of the top of the upper portion of the base plate of the wafer carrier. Similarly, the negative electrode 410B also extends around the periphery of the top plate. As shown the positively charged electrode extends around half of the periphery of the top plate while the negatively charged electrode extends around the other half of the periphery of the top plate. Both electrodes then connect to parallel fingers of electrodes which extend across the surface of the top plate. These fingers alternate in position so that a positive electrode finger is between two negative electrode fingers and vice versa. The alternating fingers of electrodes have significant benefits for holding the wafer electrostatically as described in more detail below.

The electrodes of FIG. 1A to FIG. 4A are shown as parallel lines of electrodes which are interdigitated and alternate in polarity across the surface of the base plate. The electrodes may be formed in a variety of other configurations. The particular configuration of the electrodes may be adapted to suit any particular implementation. A variety of different electrode configurations are described herein. Any one or more of these configurations may be adapted to any of the different constructions shown herein to achieve the desired complete carrier wafer design.

Figure 5:
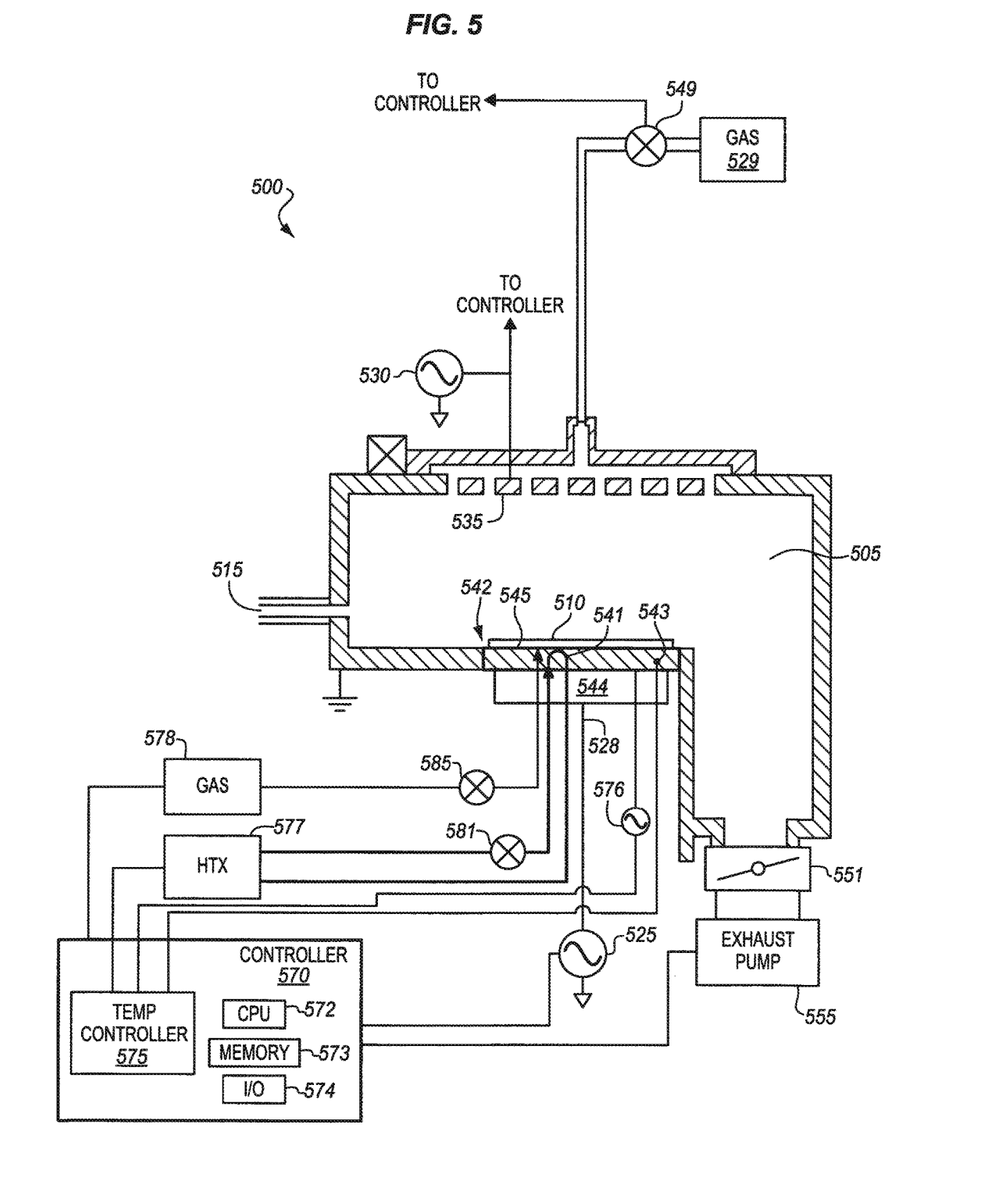
FIG. 5 is a schematic diagram of a plasma etch system including a chuck assembly to hold a substrate and substrate carrier in accordance with an embodiment of the present invention.

FIG. 5 is a schematic of a wafer processing system 500 that may be used for plasma etch for low temperature chemical vapor deposition or for a variety of other purposes. The system includes a chuck assembly 542 in accordance with an embodiment of the present invention. The processing system 500 may be any type of chamber known in the art, such as, but not limited to, Enabler™, DPS II, Advant-Edge™ G3, E-MAX®, Axiom, Orion, or Mesa CIP chambers, all of which are manufactured by Applied Materials of California, USA. Other commercially available processing chambers may similarly utilize the chuck assemblies described herein. While the exemplary embodiments are described in the context of a plasma etch system, the chuck assembly described herein is also adaptable to other processing systems used to perform other fabrication process (e.g., plasma deposition systems, etc.)

The processing system 500 includes a grounded chamber 505. Process gases are supplied from gas source(s) 529 connected to the chamber through a mass flow controller 549 to the interior of the chamber 505. Chamber 505 is evacuated via an exhaust valve 551 connected to a high capacity vacuum pump stack 555. When plasma power is applied to the chamber 505, a plasma is formed in a processing region over a workpiece 510. A plasma bias power 525 is coupled into the chuck assembly 542 to energize the plasma. The plasma bias power 525 may be in a range of from 2 MHz to 60 MHz. The plasma bias power 525 is coupled to a lower electrode (not shown) via a power conduit 528. A second plasma source power 530 or branch of the same source is coupled to a plasma generating element 535 to provide high frequency source power to inductively or capacitively energize the plasma. The plasma source power 530 may have a higher frequency than the plasma bias power 525, such as between 500 and 580 MHz, and may, for example, be in the 562 MHz band.

The workpiece 510 is loaded through an opening 515 and clamped to the chuck assembly 542 inside the chamber. The workpiece 510, such as a semiconductor wafer bonded to a carrier, may be any type of wafer, substrate, or other material bonded to any of the various wafer carriers and variations described herein. The workpiece 510 is disposed on a top surface of a dielectric layer 545 or puck of the chuck assembly that is disposed over a cooling base assembly 544 of the chuck assembly. A clamp electrode (not shown) is embedded in the dielectric layer 543. The clamp electrode provides an electrostatic force to hold the wafer to the dielectric puck 545 and is driven by a power supply 579.

A system controller 570 is coupled to a variety of different systems to control a fabrication process in the chamber. The controller 570 may include a temperature controller 575 to execute temperature control algorithms (e.g., temperature feedback control) and may be either software or hardware or a combination of both software and hardware. The system controller 570 also includes a central processing unit 572, memory 573 and input/output interface 574. The temperature controller receives a temperature reading from a sensor 543 on the chuck. The temperature sensor may be proximate a coolant channel, proximate the wafer, or placed in the dielectric material of the chuck. The temperature controller 575 uses the sensed temperature or temperatures to output control signals affecting the rate of heat transfer between the chuck assembly 542 and a heat source and/or heat sink external to the plasma chamber 505, such as a heater power supply 576 and a heat exchanger 577. The heater power supply provides current to drive one or more heaters (not shown) within the chuck assembly 542.

The system may also include a controlled heat transfer fluid loop 541 with flow controlled based on the temperature feedback loop. In the example embodiment, the temperature controller 575 is coupled to a heat exchanger (HTX)/chiller 577. Heat transfer fluid flows through a valve 581 at a rate controlled by the valve through the heat transfer fluid loop 541. The heat transfer fluid flows through conduits in the chuck assembly 542 and then returns to the HTX 577. The temperature of the heat transfer fluid is decreased by the HTX and then the fluid is returned through the loop back to the chuck assembly.

The valve 581 (or other flow control devices) between the HTX 577 and fluid conduits in the chuck assembly 542 may be controlled by the temperature controller 575 to control a rate of flow of the heat transfer fluid to the fluid loop. While the temperature controller 575, the temperature sensor 543, and the valve 581 are all shown as separate components, they may be combined in order to simplify construction and operation. In embodiments, the heat exchanger senses the temperature of the heat transfer fluid after it returns from the fluid conduit and cools the heat transfer fluid based on the temperature of the fluid and the desired temperature for the operational state of the chamber 505. The electric heaters are used in the chuck assembly to apply heat to the chuck assembly.

A backside gas source 578 such as a pressurized gas supply or a pump and gas reservoir are coupled to the chuck assembly 542 through a mass flow meter 585 or other type of valve. The backside gas may be argon or any gas that provides heat conduction between the wafer the puck without affecting the processes of the chamber. The gas source pumps gas through a gas outlet of the chuck assembly to the back side of the wafer under the control of the system controller 570 to which the system is connected.

Figure 6A:
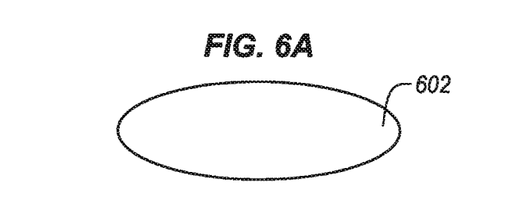
FIGS. 6A to 6D are isometric view diagrams of operational stages of fabricating and using an electrostatic substrate carrier in accordance with an embodiment of the invention.

FIGS. 6A to 6D show an example of constructing a carrier wafer as shown for example in FIG. 1A. In FIG. 6A a ceramic plate 602 such as an aluminum nitride plate is machined as a rigid substrate and insulator. The plate has a top external surface which is adapted to suit the wafer that it is designed to carry. Typically, the wafer is approximately 300 mm. in diameter and so the ceramic plate is a similar size or slightly larger. The plate may be quite thin, for example, 1 mm thick depending on the nature and structure of the ceramic material.

Figure 6B:
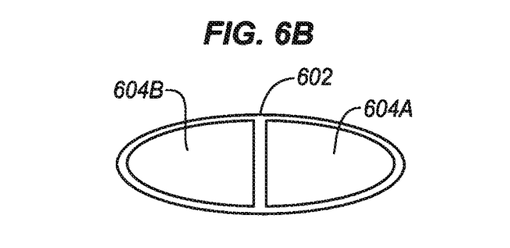

In FIG. 6B the ceramic plate 602 is plated with a copper, titanium, aluminum or other conductive material to form electrodes 604A, 604B, A variety of different materials including different metals may be used depending upon the desired characteristics. In the example of FIG. 6B the electrode is formed as a first half circle 604A of copper to form a positive electrode and a second half circle 604B of copper to form a negative electrode. In some embodiments, the copper is first plated onto the ceramic and then patterned using conventional metal patterning technologies. Any one or more of the electrode configurations described herein may be formed by patterning the metal.

Figure 6C:
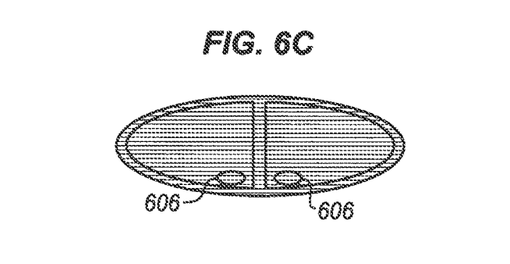

In FIG. 6C additional patterning has been applied. This may be used to form interdigitated electrodes as shown, for example, in FIG. 1B or any other desired configuration. In the illustrated example, contact points 606 are applied to the ceramic plate to allow the electrodes to be connected to an external voltage source to apply a charge to the electrodes.

Figure 6D:
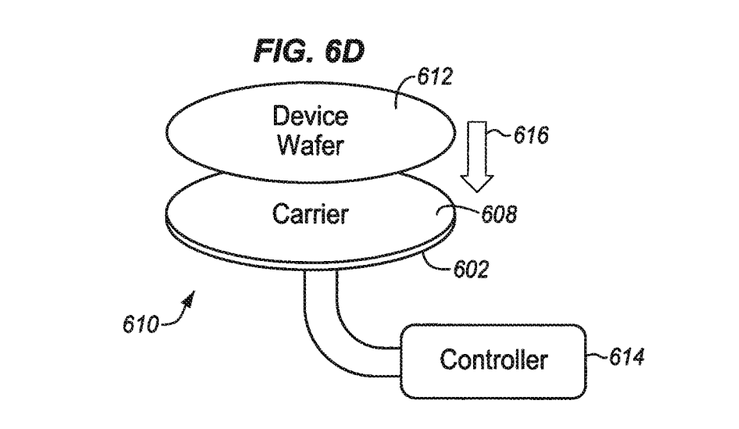

In FIG. 6D a top dielectric plate 608 such as a ceramic plate has been bonded to the top of the base plate 602 of FIG. 6C. This completed wafer carrier may be used to electrostatically attach a device wafer 612 to the completed wafer carrier 610. An external power source controller 614 may be used to apply an electrostatic charge to the electrodes. This pulls the device wafer down onto the wafer carrier as shown by the arrow 616.

Figure 7A:
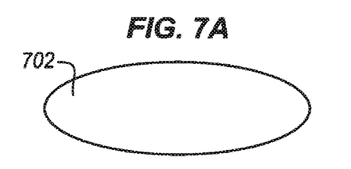
FIGS. 7A to 7G are isometric view diagrams of operational stages of fabricating and using an electrostatic substrate carrier in accordance with a second embodiment of the invention.

FIGS. 7A to 7G show an alternative process for forming a device wafer carrier. In FIG. 7A a silicon wafer 702 is used as the initial starting point instead of an aluminum nitride plate. As with the ceramic plate 602 of FIG. 6A, this silicon wafer 702 is approximately the same size or slightly larger than the device wafer which it is intended to carry. A variety of other materials may be used instead of silicon such as a polyimide glass reinforced substrate, a glass substrate or even a ceramic substrate. A silicon wafer may be as thin as 0.7 mm, however the particular thickness of the wafer may be adapted to suit any particular implementation.

Figure 7B:
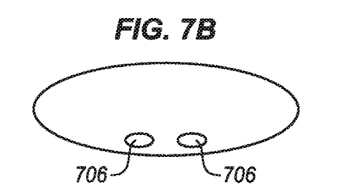

In FIG. 7B the wafer is drilled by laser or mechanical drilling. This forms contact points 706 for electrical connectors. The electrodes may be coupled to these connectors.

Figure 7C:
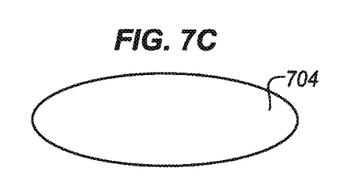
Figure 7D:
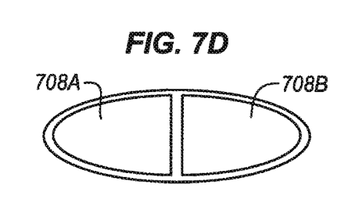

In FIG. 7C an aluminum, copper, titanium, other metal, or other conductive material is applied over the silicon wafer by, for example, sputtering, electroplating, plasma vapor deposition or any of a variety of other techniques. In FIG. 7D the metal layer 704 formed over the silicon wafer is patterned to form at least two electrodes 708A, 708B. These electrodes may be patterned as shown into a left side and a right side or as a more complex shape as described in other embodiments herein.

Figure 7E:
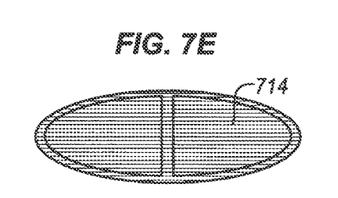
Figure 7F:
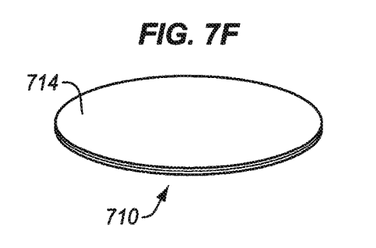
Figure 7G:
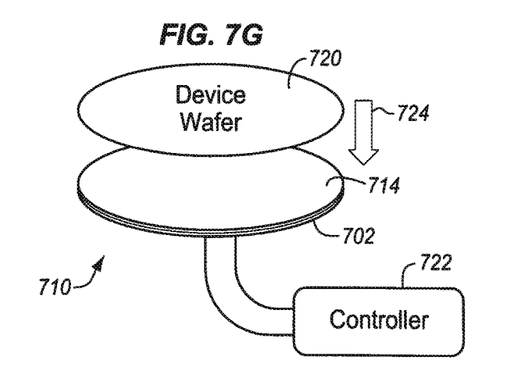

In FIG. 7E plasma vapor deposition sputtering may be used to apply an upper layer 714 of aluminum nitride or another dielectric material over the electrodes. In FIG. 7F the top surface 714 of the dielectric 702 may be polished to form the surface profile. The wafer carrier 710 is then formed with a silicon base plate 702, electrodes 708A, 708B, and a top dielectric layer 714 In FIG. 7G a device wafer 720 may be attached to this completed wafer carrier using a controller 722 to apply an electrostatic force to the electrodes through the contact points 706. This draws the wafer down toward the dielectric plate as shown by the arrow 724 where the wafer will be attached.

FIGS. 8A to 8F show a further alternative process flow to produce the wafer carrier of any one or more of FIG. 1A through 4A. This wafer carrier may be formed from multiple layers or pieces of a variety of different materials as described above. In some embodiments, a top dielectric plate is attached over a base plate using adhesive bonding or mechanical fasteners such as bolts, rivets or screws. However, in the example of FIGS. 8A to 8F, the top dielectric plate is formed over the base plate by chemical vapor deposition.

Figure 8A:
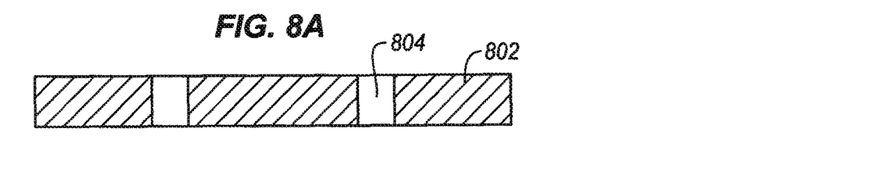
FIGS. 8A to 8F are isometric view diagrams of operational stages of fabricating and using an electrostatic substrate carrier in accordance with a third embodiment of the invention.
Figure 8B:
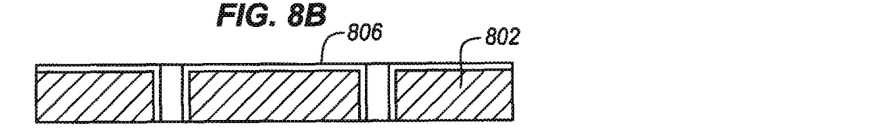

In FIG. 8A an initial base plate 802 is used. This plate may be made of ceramic, polyimide, a silicon compound, bare silicon, glass or any of variety of other materials. The plate is prepared first by laser drilling, milling, or etching to form a series of contact holes 804. In FIG. 8B the top surface of the base plate 802 is covered with a dielectric material such as a silicon dioxide. This may be done, for example, using chemical vapor deposition, of TEOS (tetraorthosilicate) or any of a variety of other materials.

Figure 8C:
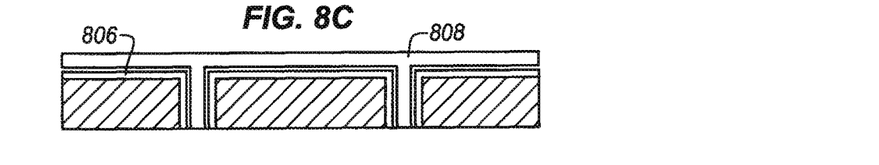

In FIG. 8C the top surface of the base plate is then covered with a metal layer 808. A plasma vapor deposition of titanium or copper may be used together. Alternatively, ECP (Electromechanical Copper Plating) may be used to deposit a metal layer 808 over the dielectric layer 806. This layer may be finished with any desired form of polishing, such as chemical mechanical polishing (CMP).

Figure 8D:
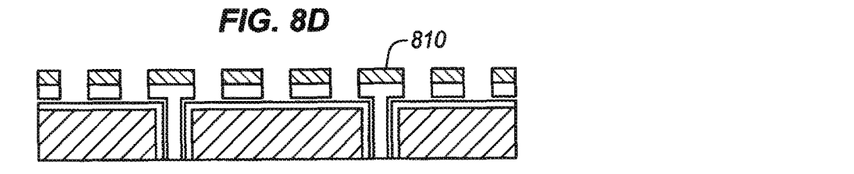

FIG. 8D shows a photoresist mask 810 formed over the metal layer. This photoresist mask is then developed and wet etched to form the desired pattern of electrodes. In the example cross-sectional diagram of FIG. 8D, the electrodes appear as a series of straight lines across the top of the base plate. However, the particular configuration from a top view may be much more complex. Any of the electrode patterns described herein may be formed by photolithography.

Figure 8E:
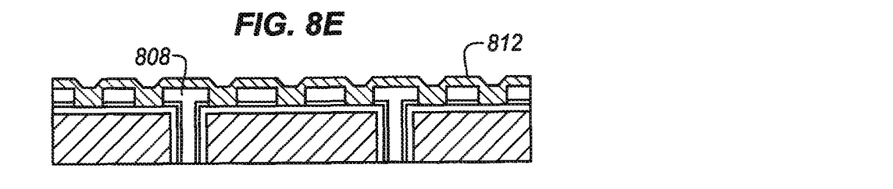
Figure 8F:
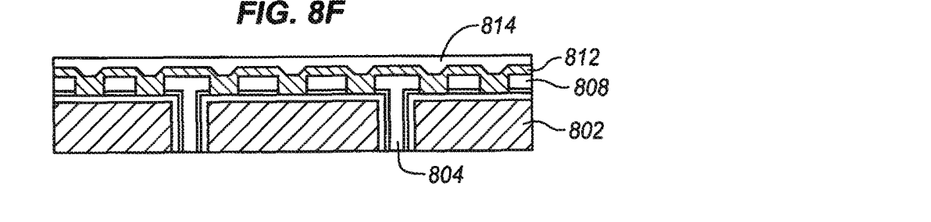

In FIG. 8E a further chemical vapor deposition is used to apply a layer of dielectric 812 between the lines of the copper electrode pattern after the photoresist has been removed. The dielectric isolates each of the electrodes from each other electrically when a charge is applied across the electrodes. In FIG. 8F the top dielectric layer 814 is formed over the electrodes by a plasma vapor deposition of aluminum nitride. The fabrication as shown in FIGS. 8A to 8F allows the wafer carrier to be formed in a conventional plasma etch chamber using conventional semiconductor processing technologies.

Figure 9:
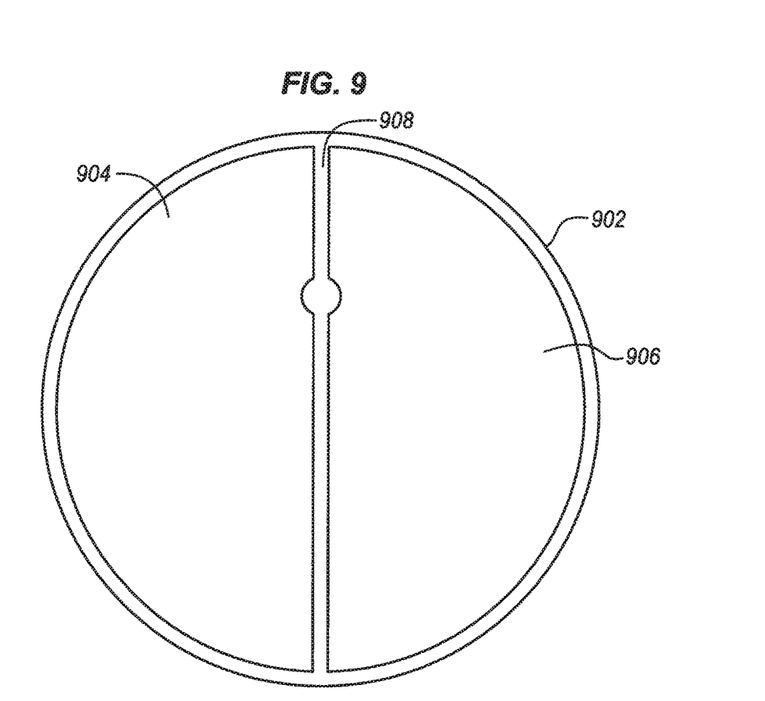
FIG. 9 is a top plan view diagram of an electrode pattern suitable for use with any of the substrate carriers described herein in accordance with an embodiment of the invention.

A variety of different electrode configurations may be used depending upon the nature of the wafer to be carried and the forces that are to be applied to the wafer. FIG. 9 shows a simple electrode configuration in which the base plate 902 is bisected by a diameter from one side of the top circular surface of the base plate to the other side of the circular base plate. A first electrode 904 occupies one-half of the circle of the top surface of the base plate and a second electrode 906 occupies the other half. This provides one electrode to be positively charged and the other electrode to be negatively charged. There is a space between the electrodes 908 which allows the electrodes to hold their charge after electrostatic energy has been applied to the two electrodes. This simple design is sufficient to hold device wafers through a variety of physical disturbances.

Figure 10:
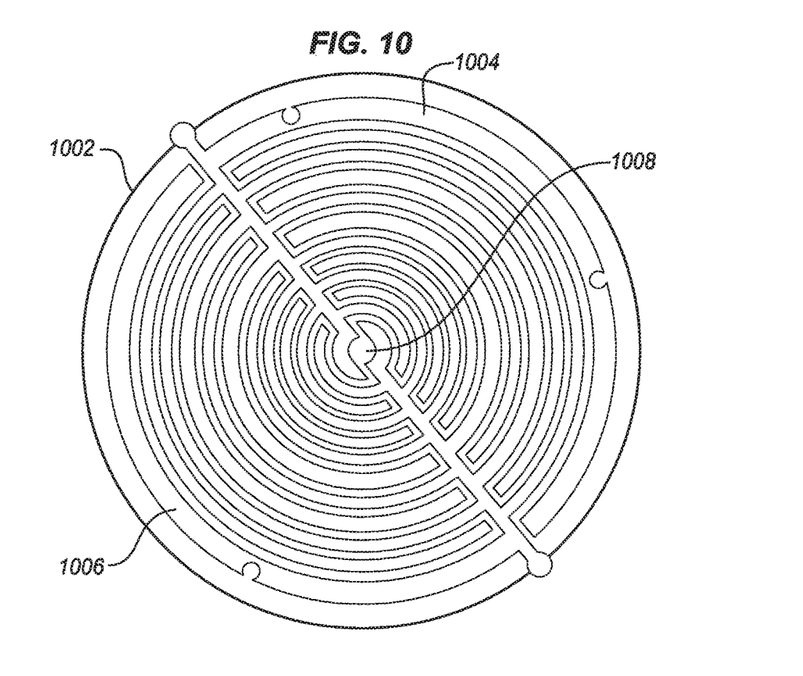
FIG. 10 is a top plan view diagram of a second electrode pattern suitable for use with any of the substrate carriers described herein in accordance with an embodiment of the invention.

FIG. 10 shows a more complex configuration in which the base plate 1002 has a first electrode 1004 and a second electrode 1006. The base plate 1002 is still divided in half, however, the electrodes form a path of semi-circular arcs, which are concentric around the center of the base plate 1008. The arcs of the first electrode are surrounded by arcs of the second electrode so that from the peripheral edge of the base plate 1002 toward the center of the base plate the electrode arcs alternate from positive to negative progressing toward the center. These concentric semicircular arcs cover the entire surface of the base plate and are interdigitated as alternating semicircles.

Figure 11:
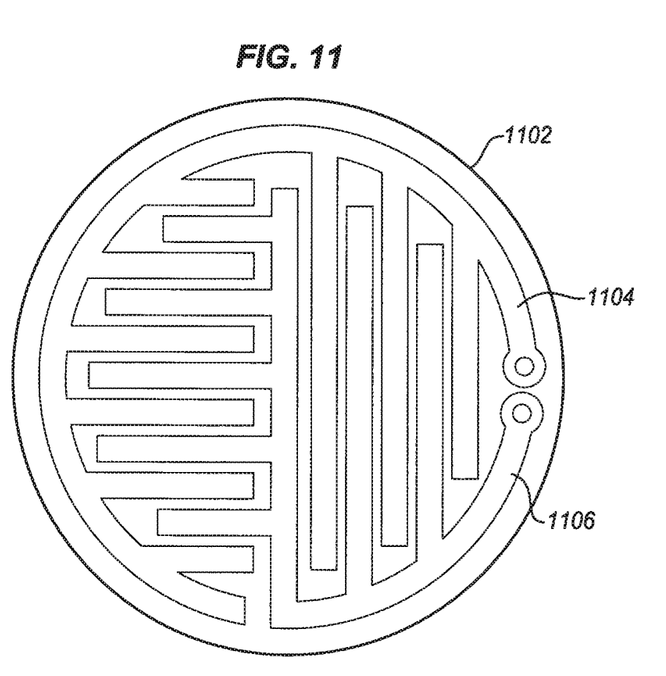
FIG. 11 is a top plan view diagram of a third electrode pattern suitable for use with any of the substrate carriers described herein in accordance with an embodiment of the invention.

FIG. 11 shows an alternative embodiment in which the top plate 1102 has two electrodes 1104 and 1106. As in the example of FIG. 2B, the electrodes are arranged as interdigitated lines that cross from one side of the base plate 1102 to the other side of the base plate to form parallel fingers across the base plate. However, in the example of FIG. 11 the circular base plate is again bisected or divided in half into two semicircles. On one semicircle the interdigitated electrodes are arranged in a first direction and on the other semicircle the interdigitated electrodes extend in an orthogonal direction 90° from the direction on the other side. As shown in the diagram of FIG. 11, the left half of the circular base plate has horizontal electrodes as shown on the sheet and the right half of the base plate 1102 has vertical electrodes. This allows the alternation between positive and negative electrode to be more effective across the surface of the plate. In addition, the change in direction further resists horizontal translation of the wafer across the wafer carrier. As shown on the page, the horizontal electrodes resist movement of the wafer up and down the page while the vertical electrodes resist movement of the wafer from side to side. The alteration of the direction of electrodes provides greater resistance to any translation of the wafer across the wafer carrier.

Figure 12:
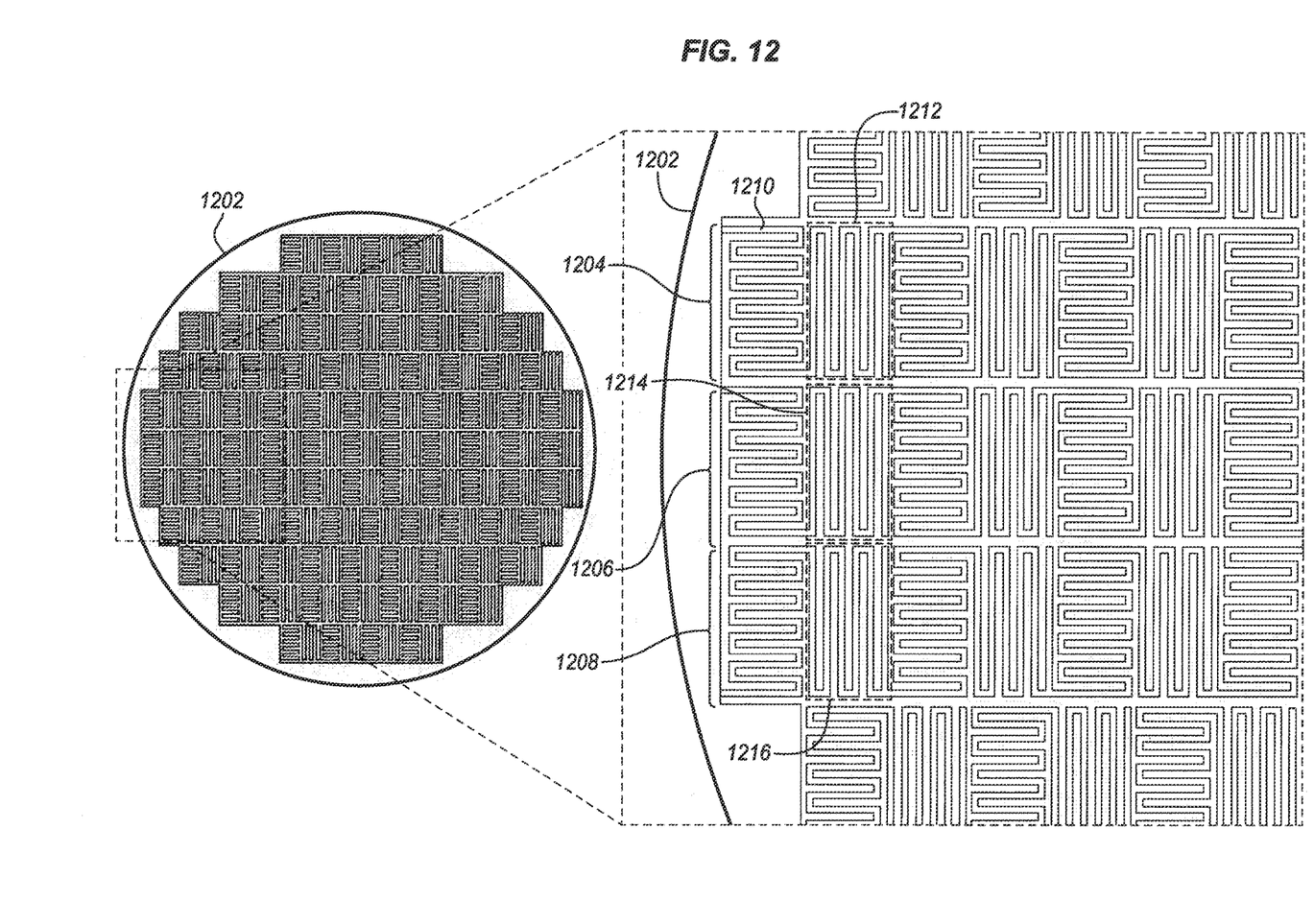
FIG. 12 is a top plan view diagram including an enlarged section of a fourth electrode pattern suitable for use with any of the substrate carriers described herein in accordance with an embodiment of the invention.

FIG. 12 shows a portion of a base plate 1202 in which the orthogonal variation in the direction of the electrodes has been extended into a very fine pitch electrode pattern. In the example of FIG. 12, the circular face of the top of the base plate 1202 has been divided into a grid of rectangular blocks. Each block has a fine pattern of electrodes that are arranged in either a horizontal or vertical direction. Each block is either positive or negative. The blocks in a sequence alternate in direction, polarity or both.

As shown, a portion near one edge of the base plate has a vertical sequence or column of a first block 1204, a second block 1206, and a third block 1208. These blocks all have horizontal electrodes 1210, but alternate in polarity. In the next column, the set of three blocks 1212, 1214, and 1216 have vertical electrodes and also alternate in charge. These blocks of vertical electrodes are adjacent and immediately placed next to the blocks of horizontal electrodes. This pattern of alternating between horizontal and vertical electrodes across the entire surface of the block within the pattern of electrodes allows resistance to translational forces on the wafer to be created in a finer pattern. This increases the carrier's ability to hold onto the wafer against such translational forces.

Just as the pattern of electrodes in FIG. 12 is much finer than that of, for example, FIG. 1B, any of the other patterns shown herein may also be made much finer or much coarser depending on the particular implementation. Using the photolithography techniques described herein, a very fine pattern of copper, titanium, molybdenum, or other type of electrodes may be formed.

Figure 13:
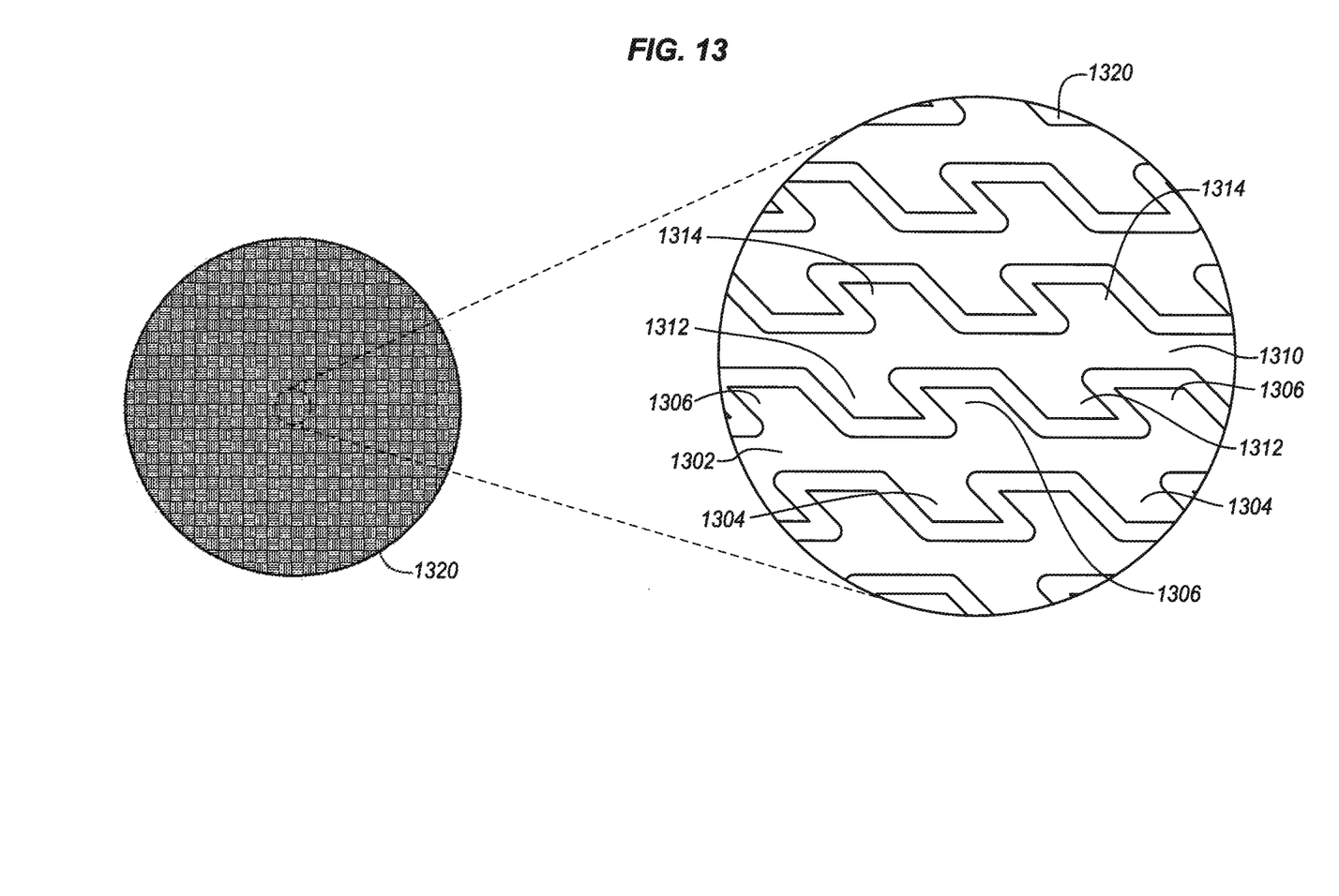
FIG. 13 is a top plan view diagram including an enlarged section of a fifth electrode pattern suitable for use with any of the substrate carriers described herein in accordance with an embodiment of the invention.

FIG. 13 shows a further variation in the electrodes which may be applied to any of the linear or arc shaped electrodes described herein. Each electrode 1302 has a series of spurs or stubs which extend from the otherwise linear extension of the electrode. These spurs extend both upwards 1306 and downwards 1304. Similarly, a next nearest electrode with opposing polarity 1310 has spurs which extend downwards 1312 and spurs which extend upwards 1314. The downward extending spurs 1312 of the upper electrode extend between upward extending spurs 1306 of the lower electrode 1302.

As a result, in addition to alternating polarities of linear electrodes 1302, 1310 the spurs 1312 present a more complex interdigitated pattern of spurs 1312, 1306 alternating in polarity as well. These spurs may extend either orthogonal to the main line of the linear electrode or in an angular direction. In the illustrated example the spurs are about 30° offset from the orthogonal direction, however, the particular angle of the spurs from the linear electrode may be adapted to suit any particular implementation. This interlocking pattern of spurs create further variations in positive and negative charge which allow the electrostatic wafer carrier to resist forces applied against the wafer that it carries.

Figure 14:
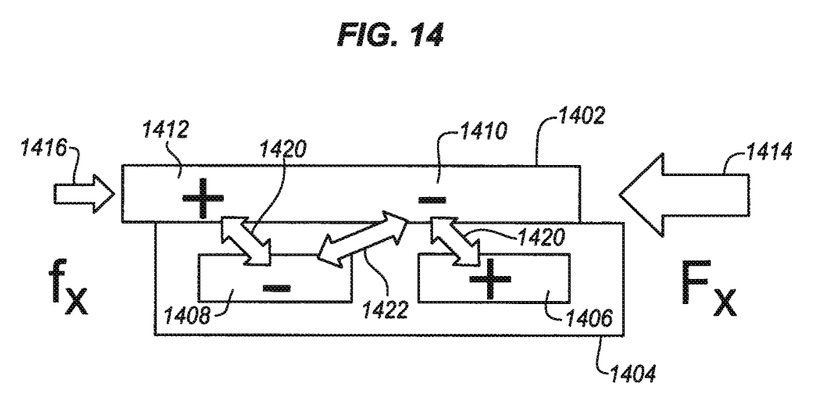
FIG. 14 is a side cross-sectional view diagram of electrostatic forces on a substrate and a substrate carrier in accordance with an embodiment of the invention.

FIG. 14 shows a wafer carrier 1404 supporting a wafer 1402. In this simplified cross-sectional diagram, the wafer carrier has a positive electrode 1406 and a negative electrode 1408. The positive electrode 1406 creates a negatively charged domain 1410 on the wafer to hold the wafer onto the wafer carrier. Similarly, the negatively charged electrode 1408 creates a positively charged domain 1412 on the wafer. If a large translational force, as shown by the large arrow 1414, is applied to the edge of the wafer to translate the wafer off of the wafer carrier, this force is resisted by the electrostatic charge represented by the positive electrode 1406 and negative domain 1410 on the wafer. As the wafer is translated in the left direction as shown on the diagram, a counterforce 1416 is created in the opposite direction. This counterforce is due to an attractive force indicated by arrows 1408 and 1420 between the electrode and oppositely charged domain on the wafer.

In addition, there is a repulsive force 1422 which is between the negative electrode 1408 and the negatively charged domain 1410 of the wafer 1402. The attractive forces between the wafer carrier and the wafer as well as the repulsive forces between the carrier and the wafer push the wafer back into its original position tending to restore the wafer with a translational force. By increasing the number of positive and negative domains on the wafer the number of restoring repulsive forces 1422 is increased. While the amount of charge of each domain will not be increased, the number of domains and consequent repulsive forces is increased. Accordingly, the fine patterns across the entire surface of the base plate tend to repulse the translational force 1414 more effectively than a simple bipolar semicircular pattern as shown, for example, in FIG. 9.

It is to be understood that the above description is intended to be illustrative, and not restrictive. For example, while sequential diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A carrier to carry a substrate for processing, the carrier comprising:
    a dielectric top plate having a top side and a bottom side and configured to be attached on a top side of the plate to a substrate using electrostatic force;
    a dielectric base plate coupled to a bottom side of the dielectric plate, the base plate having a bottom side that is configured to be carried by a chuck;
    electrodes between the dielectric base plate and the dielectric top plate and extending across the base plate parallel to the top side of the top dielectric plate, the electrodes configured to carry an electrostatic charge between the base plate and the top plate and formed so that electrodes of a first charge are positioned near electrodes of a second charge; and
    connectors extending from the bottom side through the base plate to the electrodes to couple the electrodes to a source of electrostatic charge through the bottom side, the connectors being configured to be covered when the carrier is carried by a chuck.

2. The carrier of claim 1, wherein the base plate comprises a ceramic disk and the electrodes are formed over the ceramic so that the electrodes are adjacent to the ceramic.

3. The carrier of claim 1, wherein the base plate comprises a ceramic bottom plate and a polymer top plate and wherein the electrodes are formed on the polymer top plate.

4. The carrier of claim 1, wherein the base plate comprises an amorphous bottom plate and a polymer top plate and wherein the electrodes are, formed on the polymer top plate.

5. The carrier of claim 4, wherein the amorphous bottom plate is formed of a glass and the polymer top plate is formed of a silicon.

6. The carrier of claim 4, further comprising an embedded capacitor between the bottom plate and the top plate.

7. The carrier of claim 1, wherein the electrodes form interdigitated parallel lines of positive and negative charge.

8. The carrier of claim 1, wherein the electrodes form an arc around the periphery of the base plate with parallel lines extending from the arc across the base plate and wherein the parallel lines are interdigitated.

9. The carrier of claim 7, wherein the parallel lines include spurs extending from the parallel lines, the spurs of one electrode extending between spurs of another electrode on either side of the one electrode.

10. The carrier of claim 7, wherein the spurs extend from the parallel lines at an angle offset from orthogonal.

11. The carrier of claim 1, wherein the substrate is a thinned silicon wafer and the processing is semiconductor processing in a processing chamber.

12. A method of making a carrier to carry a substrate for processing, the method comprising:
    depositing a conductive layer over a substrate;
    patterning the conductive layer into positive and negative electrodes;
    depositing a dielectric layer over the conductive layer and the substrate; and
    depositing a ceramic layer over the dielectric layer.

13. The method of claim 12, further comprising depositing a dielectric layer over the substrate before depositing the conductive layer.

14. The method of claim 12, wherein depositing a conductive layer comprises applying a metal layer by chemical vapor deposition and polishing the metal layer by chemical mechanical polishing.

15. The method of claim 12, wherein patterning the conductive layer comprises applying a photoresist, patterning the photoresist, and etching the conductive layer to form the pattern.

16. The method of claim 12, wherein depositing a ceramic layer comprises depositing aluminum nitride by chemical vapor deposition.

17. The method of claim 16, further comprising polishing the aluminum nitride.

18. A wafer carrier for semiconductor processing, the carrier comprising:
    a base plate having a first and second dielectric layers and a capacitor layer between the first and second dielectric layers;
    a plurality of interdigitated electrodes formed over the first dielectric layer, the electrodes to carry an electrostatic charge so that the interdigitated electrodes alternate between positive and negative charge when charged;
    a ceramic plate over the top dielectric layer of the base plate having a top surface configured to carry a silicon wafer.

19. The wafer carrier of claim 18, wherein the ceramic plate is formed of aluminum nitride by chemical vapor deposition over the top dielectric layer.

20. The wafer carrier of claim 18, wherein the electrodes are formed by depositing a metal layer over the top dielectric layer and patterning the metal layer using photolithography.

* * * * *